(12) United States Patent
Gipson et al.

(10) Patent No.: US 10,715,140 B2
(45) Date of Patent: Jul. 14, 2020

(54) LAMINATED LIGHT GUIDE AND ELECTRICAL COMPONENT CARRIER

(71) Applicant: Dura Operating, LLC, Auburn Hills, MI (US)

(72) Inventors: Ron G. Gipson, Metamora, MI (US); Bhanumurthy Veeragandham, Auburn Hills, MI (US)

(73) Assignee: DURA OPERATING, LLC, Auburn Hills, MI (US)

( * ) Notice: Subject to any disclaimer, the term of this patent is extended or adjusted under 35 U.S.C. 154(b) by 95 days.

(21) Appl. No.: 15/827,371

(22) Filed: Nov. 30, 2017

(65) Prior Publication Data

US 2019/0165781 A1 May 30, 2019

(51) Int. Cl.
*H03K 17/96* (2006.01)
*F21V 8/00* (2006.01)
(Continued)

(52) U.S. Cl.
CPC .......... *H03K 17/962* (2013.01); *G02B 6/006* (2013.01); *G02B 6/0031* (2013.01); *G02B 6/0043* (2013.01); *G02B 6/0073* (2013.01); *G02B 6/0081* (2013.01); *G02B 6/0083* (2013.01); *G02B 6/0091* (2013.01); *G06F 3/044* (2013.01); *H05K 5/0017* (2013.01); *H03K 2217/96042* (2013.01); *H03K 2217/96079* (2013.01); *H03K 2217/960785* (2013.01); *H05K 1/16* (2013.01)

(58) Field of Classification Search
None
See application file for complete search history.

(56) References Cited

U.S. PATENT DOCUMENTS

| 9,869,810 B2 | 1/2018 | Keranen et al. | |
| 2001/0019487 A1* | 9/2001 | Honguh | G02B 6/0038 362/551 |

(Continued)

FOREIGN PATENT DOCUMENTS

| EP | 3444096 A1 | 2/2019 |
| WO | 2017077193 A1 | 5/2017 |

(Continued)

OTHER PUBLICATIONS

US 9,915,556 B2, 03/2018, Keränen et al. (withdrawn)

*Primary Examiner* — Benjamin C Lee
*Assistant Examiner* — Emily J Frank
(74) *Attorney, Agent, or Firm* — Vivacqua Crane PLLC

(57) ABSTRACT

A laminated light guide and component carrier includes a light guide of a light transmissive polymeric material. The light guide has a pocket in a first face. First electrical traces are printed on the first face. A light emitting diode is positioned in the pocket and supported on the light guide by attachment legs which extend outward from the pocket electrically connecting the light emitting diode to the first electrical traces. A light reflector is formed as a texturally modified area of the light guide directly aligned with the light emitting diode. A capacitive touch sensor is printed on a light guide second face and connected to second electrical traces defining capacitive touch traces printed on the second face. A window region of the light guide is defined where the capacitive touch sensor is aligned with the light reflector and the light emitting diode.

19 Claims, 4 Drawing Sheets

(51) Int. Cl.
  *H05K 5/00*    (2006.01)
  *G06F 3/044*   (2006.01)
  *H05K 1/16*    (2006.01)

(56) References Cited

U.S. PATENT DOCUMENTS

| | | |
|---|---|---|
| 2005/0051789 A1 | 3/2005 | Negley et al. |
| 2007/0121326 A1* | 5/2007 | Nall ................... F21V 29/004 362/294 |
| 2010/0259497 A1 | 10/2010 | Livingston et al. |
| 2011/0149594 A1 | 6/2011 | Terajima et al. |
| 2012/0206680 A1* | 8/2012 | Onishi ................ G02B 6/005 349/122 |
| 2014/0036428 A1 | 2/2014 | Leong et al. |
| 2015/0098205 A1 | 4/2015 | Keranen et al. |
| 2015/0138831 A1* | 5/2015 | Okano ................ G02B 6/0021 362/609 |
| 2015/0308639 A1 | 10/2015 | Keranen et al. |
| 2016/0295702 A1 | 10/2016 | Heikkinen et al. |
| 2016/0345437 A1 | 11/2016 | Heikkinen et al. |
| 2019/0049649 A1* | 2/2019 | Hayashi .............. H01L 25/0753 |

FOREIGN PATENT DOCUMENTS

| | | |
|---|---|---|
| WO | 2017178701 A1 | 10/2017 |
| WO | 2017178702 A1 | 10/2017 |
| WO | 2017178703 A1 | 10/2017 |
| WO | 2018100243 A2 | 6/2018 |

* cited by examiner

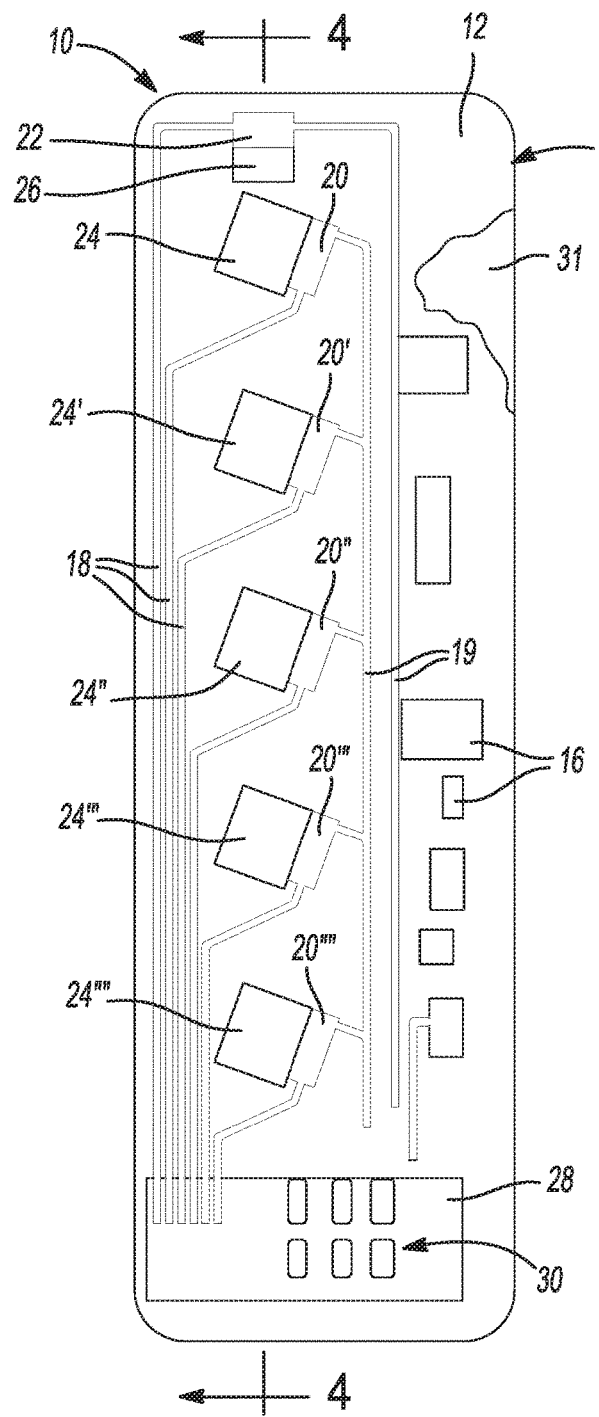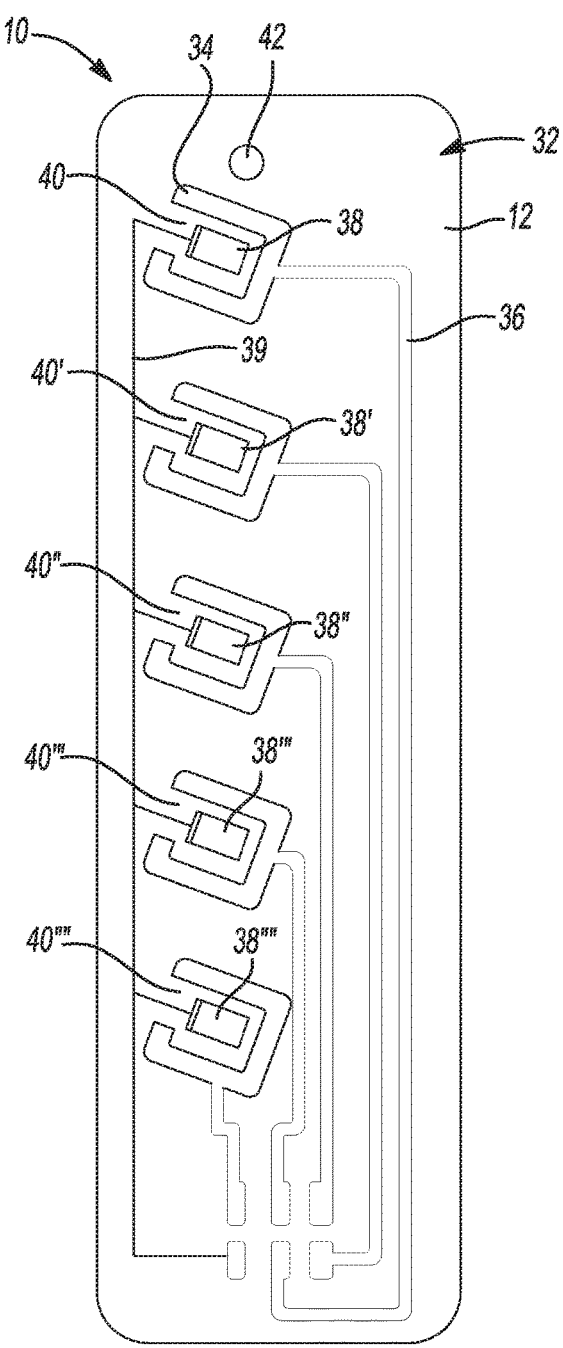
FIG. 1
FIG. 2

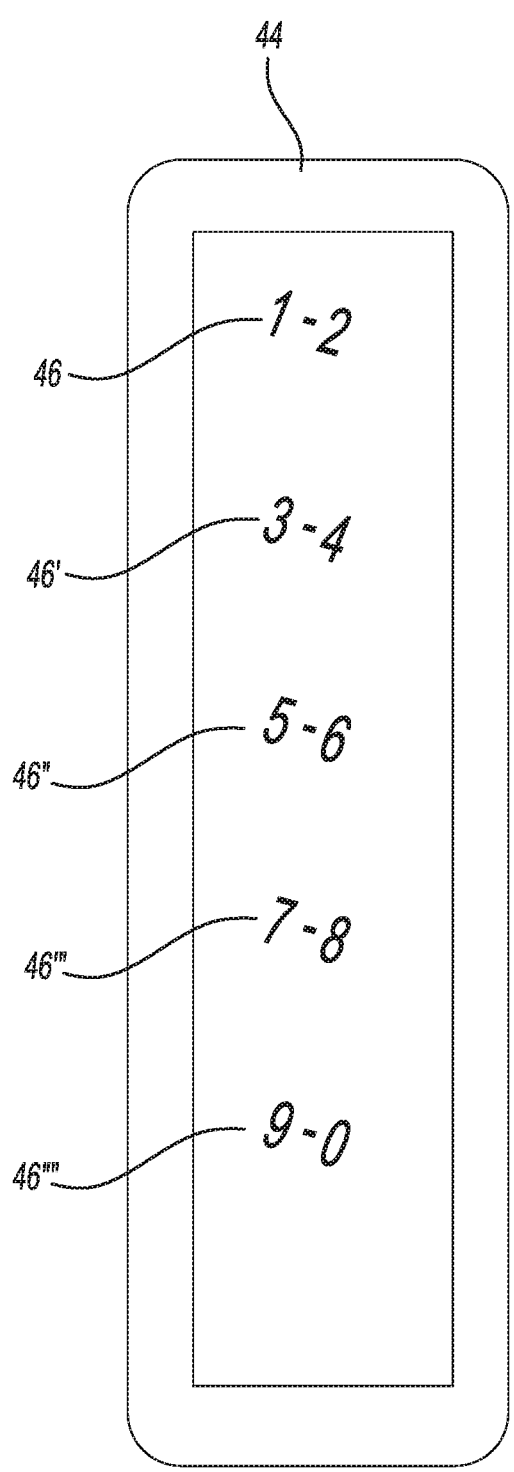
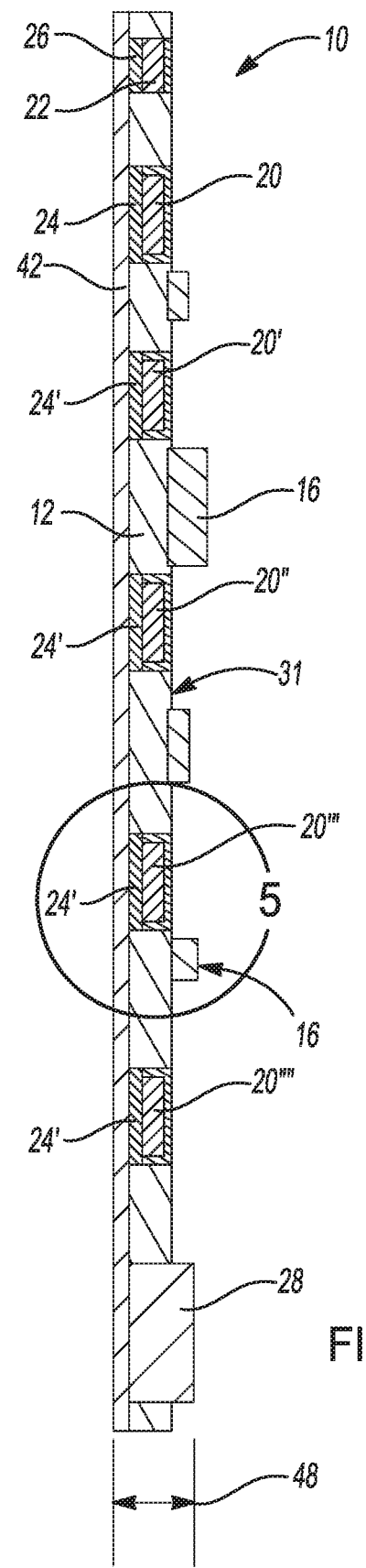
FIG. 3
FIG. 4

LAMINATED LIGHT GUIDE AND ELECTRICAL COMPONENT CARRIER

FIELD

The present disclosure relates generally to injection molded back-lit capacitive-change number pads.

BACKGROUND

The statements in this section merely provide background information related to the present disclosure and may or may not constitute prior art.

Electronic assemblies with backlit visual elements may be manufactured via several processes. Most commonly, a plastic part of a polymeric material resin is molded with some portion of the plastic being clear or translucent, with electronic components including one or more light sources attached mechanically to the part after molding, so that light is visible through the clear or translucent portion, resulting in a backlighting effect. More recently, methods have been developed of embedding one or more light sources in a molded plastic part. One such method is to encapsulate light sources and associated electronic components (collectively "package") in a clear resin via low-pressure molding and then to injection-mold plastic over or around the encapsulated package. The encapsulated package is thereby embedded in the plastic, with some portion of the plastic being clear or translucent so that light from the encapsulated package is visible through the clear or translucent plastic, resulting in a backlighting effect.

Another such method is to mount light sources and associated electronics ("package") onto a polymer film, form the film into a desired shape, and then insert the formed film into an injection mold having substantially the same shape. A following step injection-molds plastic onto the film such that the package is embedded between the film on which it is mounted and the plastic that has been molded onto it, with portions of the film and/or plastic being clear or translucent such that light from the light sources is visible from the part exterior, resulting in a backlighting effect.

Electronic components may also be printed onto a film. The film is then inserted into an injection mold, where plastic is molded onto the film, the electronic components being embedded in the molded plastic so that when the plastic part is removed from the mold the film is peeled away from the plastic part, leaving the electronic components embedded in or adhered to the surface of the plastic part.

Thus, while current printed film assemblies achieve their intended purpose, there is a need for a new and improved system and method for printing film assemblies having light emitting diodes encapsulated in a light guide.

SUMMARY

According to several aspects, a laminated light guide and component carrier includes a light guide having a pocket created in a first face. A light emitting diode is positioned in the pocket. First electrical traces are printed on the first face of the light guide with the light emitting diode connected to the first electrical traces. A light reflector is formed as a texturally modified area of the light guide within the light guide and proximate to the light emitting diode. Second electrical traces are printed on a second face of the light guide.

In another aspect of the present disclosure, the light guide including the light reflector is made of a light transmissive polymeric material with the light reflector defining a pebbled area.

In another aspect of the present disclosure, the light emitting diode is directly supported on the light guide by attachment legs which extend outward the pocket to electrically connect the light emitting diode to the first electrical traces.

In another aspect of the present disclosure, the light emitting diode includes a lens positioned directly in alignment with the texturally modified area of the light reflector to maximize light reflection within the light guide.

In another aspect of the present disclosure, a capacitive touch sensor is printed on the second face of the light guide, the capacitive touch sensor connected to the second electrical traces. A polymeric opaque film is adhesively bonded to the second face over the capacitive touch sensor and the second electrical traces. A window region is defined where the capacitive touch sensor is aligned with the light reflector and the light emitting diode.

In another aspect of the present disclosure, light generated by the light emitting diodes of the light guide is blocked from passing through the opaque film except at individual locations of indicia individually defining light transparent portions created in the opaque film.

In another aspect of the present disclosure, the indicia are each individually aligned with the window region where maximum light enhancement is achieved by the light reflector.

In another aspect of the present disclosure, a white film is applied or ink printed over the first face of the light guide except where the light emitting diode is bonded to the electrical traces, the white film enhancing light reflection within the light guide.

In another aspect of the present disclosure, multiple electrical components are mounted on the first face of the light guide and connected to the first electrical traces.

In another aspect of the present disclosure, the second electrical traces are connected to the first electrical traces by electrical vias extending through the light guide, with the first electrical traces and the second electrical traces connected to a connector positioned on the first face of the light guide.

In another aspect of the present disclosure, an opaque polymeric material layer commonly applied over the light emitting diode and the first face of the light guide and extending beyond a perimeter of the light guide.

In another aspect of the present disclosure, a transparent cover layer extending over the second face of the light guide opposite to the first face and a portion of the opaque polymeric material extending beyond the perimeter of the light guide.

In another aspect of the present disclosure, the transparent cover layer is applied onto a surface of the opaque polymeric material layer which is substantially co-planar with an outside face of the opaque polymeric material layer.

According to several aspects, a laminated light guide and component carrier includes a light guide of a light transmissive polymeric material, the light guide having a pocket created in a first face. First electrical traces are printed on the first face of the light guide. A light emitting diode is positioned in the pocket and supported on the light guide by attachment legs which extend outward from the pocket to electrically connect the light emitting diode to the first electrical traces. A light reflector is formed as a texturally modified area of the light guide within the light guide, the light reflector directly aligned with the light emitting diode. At least one capacitive touch sensor is printed on a second face of the light guide, each capacitive touch sensor connected to second electrical traces defining capacitive touch traces printed on the second face of the light guide. A window region of the light guide is defined where the at least one capacitive touch sensor is aligned with the light reflector and the light emitting diodes.

In another aspect of the present disclosure, an opaque polymeric material layer is commonly applied over the light emitting diode and the first face of the light guide and extending beyond a perimeter of the light guide; and a transparent cover layer extends over the second face of the light guide opposite to the first face and a portion of the opaque polymeric material extending beyond the perimeter of the light guide.

In another aspect of the present disclosure, multiple electrical components mounted on the first face of the light guide electrically connected to the first electrical traces, wherein the light emitting diode, the capacitive touch sensors, the electrical components and the first electrical traces and the second electrical traces are supported directly by and on the light guide.

In another aspect of the present disclosure, the texturally modified area defining the light reflector is positioned proximate to a wall of the pocket.

In another aspect of the present disclosure, a polymeric opaque film is adhesively bonded to the second face over the capacitive touch sensors and the second electrical traces, wherein light generated by the light emitting diode is blocked from passing through the opaque film except at individual locations of indicia individually defining light transparent portions created in the opaque film.

According to several aspects, a laminated light guide and component carrier includes a light guide of a light transmissive polymeric material, the light guide having multiple pockets created in a first face. First electrical traces are printed on the first face of the light guide. Multiple light emitting diodes are each positioned in one of the pockets and are supported on the light guide by attachment legs which extend outward from each of the pockets to individually electrically connect the light emitting diodes to the first electrical traces such that the light emitting diodes are supported directly on the light guide. Multiple light reflectors are each formed as texturally modified areas of the light guide within the light guide, each positioned proximate to one of the pockets containing one of the light emitting diodes. A white film is applied or ink printed over the first face of the light guide except where the light emitting diodes are bonded to the electrical traces, the white film enhancing light reflection of the light reflectors. Multiple capacitive touch sensors are printed on a second face of the light guide, each of the capacitive touch sensors connected to second electrical traces defining capacitive touch traces printed on the second face of the light guide. A polymeric opaque film is adhesively bonded to the second face over the capacitive touch sensors and the second electrical traces, wherein light generated by any of the light emitting diodes is blocked from passing through the opaque film except at individual locations of multiple indicia individually defining light transparent portions of the opaque film. A window region is defined where each of the capacitive touch sensors is aligned with one of the light reflectors, each window region positioned in alignment with one of the indicium.

In another aspect of the present disclosure, a connector mounted on the first face having the first electrical traces connected to the connector; wherein the second electrical traces are passed through vias extending through the light guide and are connected to the connector.

Further areas of applicability will become apparent from the description provided herein. It should be understood that the description and specific examples are intended for purposes of illustration only and are not intended to limit the scope of the present disclosure.

DRAWINGS

The drawings described herein are for illustration purposes only and are not intended to limit the scope of the present disclosure in any way.

FIG. 1 is a top plan view of a laminated light guide and component carrier according to an exemplary embodiment;

FIG. 2 is a bottom plan view of the laminated light guide and component carrier of FIG. 1;

FIG. 3 is a plan view of an opaque film for application onto the laminated light guide and component carrier of FIG. 2;

FIG. 4 is a cross sectional end elevational view taken at section 4 of FIG. 1;

DETAILED DESCRIPTION

Figures 5, 6:
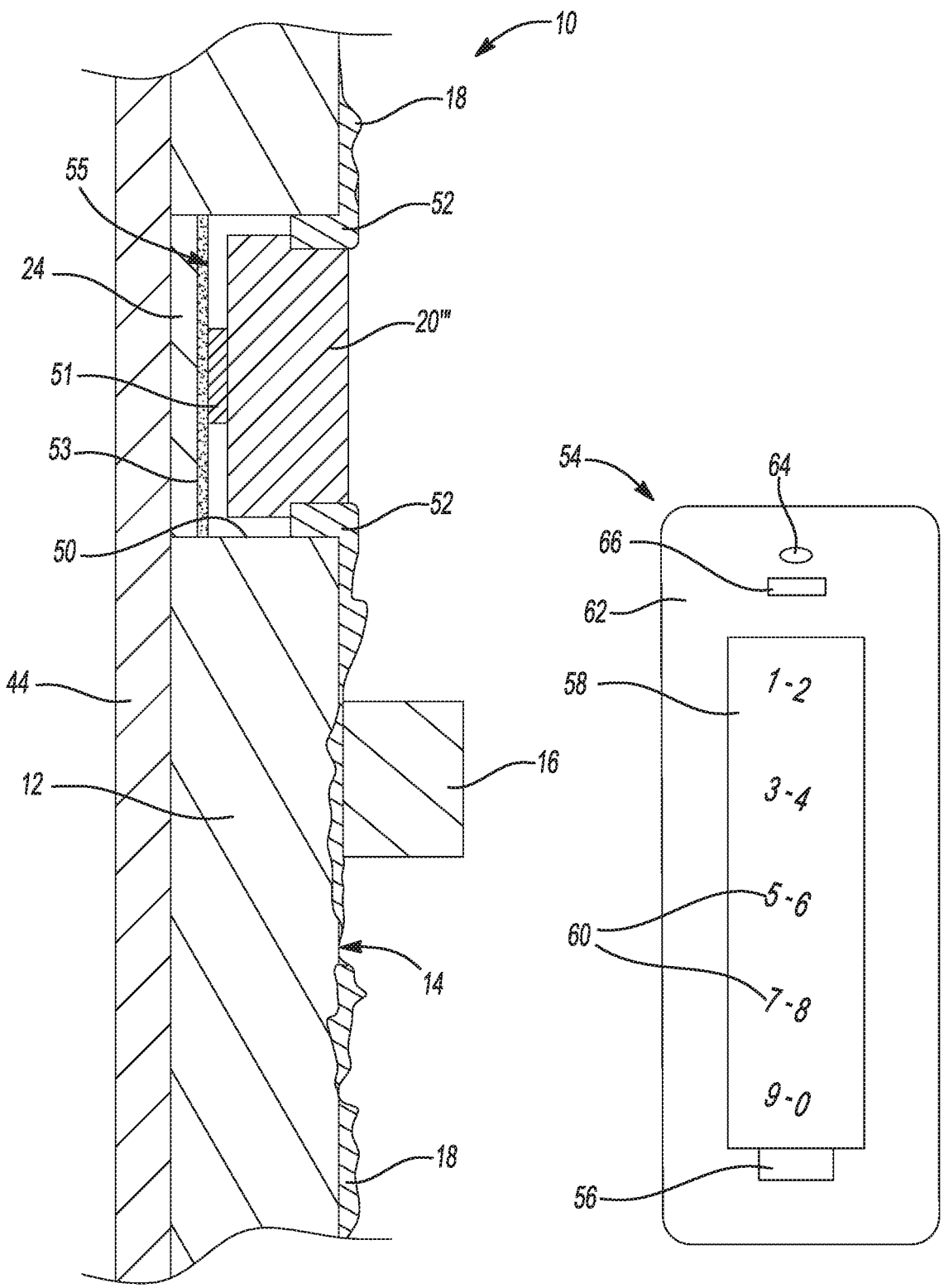
FIG. 5 is a cross sectional end elevational view of area 5 of FIG. 4.
FIG. 6 is a top plan view of another aspect of a laminated light guide and component carrier of the present disclosure.

The following description is merely exemplary in nature and is not intended to limit the present disclosure, application, or uses.

Referring to FIG. 1, a laminated light guide and component carrier 10 includes a transparent or a substantially light transmissive polymeric material light guide 12, made for example from a polycarbonate material or a poly-methyl-methacrylate (PMMA) material. According to several aspects, the light guide 12 defines a rectangular shape. On a first side or face 14 of the light guide 12 are located multiple electronic components 16 including capacitors, which are electrically connected to a plurality of first electrical traces 18, 19 printed for example by a screen printing process onto the first face 14. Multiple light emitting diodes 20, 20', 20", 20''', 20'''' are individually positioned in cavities or pockets created in the first face 14, which will be described in greater detail in reference to FIGS. 4 and 5. An additional light emitting diode 22 can optionally be provided at one end of the light guide 12 in a separate pocket created for this purpose to provide an illuminated indication that electrical power is available for the laminated light guide and component carrier 10.

Positioned proximate to each of the light emitting diodes 20, 20' is an individual light reflector 24, 24', 24", 24''', 24'''' which each define an area of the light guide 12 having a "pebbled", texturally modified area or geometry proximate to each of the light emitting diodes 20, 20', 20", 20''', 20''''. The light reflectors 24, 24', 24", 24''', 24'''' are features of the light guide 12 itself created to locally enhance, reflect and scatter the light generated by the light emitting diodes 20, 20', 20", 20''', 20'''' and are therefore formed as texturally modified areas of portions of the light guide 12 entirely within an envelope of the light guide 12, each proximate to one of the light emitting diodes. A separate light reflector 26 may also be provided proximate to the light emitting diode 22, which is similar to the light reflectors 24, 24', 24", 24'", 24"" in design and function.

Also positioned on the first face 14 of the light guide 12 is a connector 28 which is connected to the electrical traces 18, 19. Multiple capacitive touch film contacts 30 are provided within the space envelope of the connector 28. According to several aspects, a white film 31, only a portion of which is shown for clarity, can be applied or ink printed over the entire first face 14 of the light guide 12 except at locations where the electronic components 16 and the light emitting diodes 20, 20', 20", 20'", 20"", 22 are electrically connected to the circuit or electrical traces 18, 19. The white film 31 further enhances light reflection for light generated by the light emitting diodes.

Referring to FIG. 2 and again to FIG. 1, on an opposite second face 32 of the light guide 12 are printed multiple touch capacitive circuits 34 which are connected to touch capacitive second electrical traces 36 and are further connected by apertures or vias extending through the light guide 12 to the connector 28 positioned on the first face 14 of the light guide 12. A touch capacitive sensor 38, 38', 38", 38'", 38"" is also positioned proximate to each of the touch capacitive circuits 34, which are connected by electrical traces 39 to the connector 28. A window region 40, 40', 40", 40'", 40"" unobstructed by direct through-passage of the electrical traces or the electrical components is maintained through the light guide 12 proximate to each of the touch capacitive sensors 38 and aligned with the light reflectors 24, 24', 24", 24'", 24"". Each window region 40, 40', 40", 40'", 40"" permits light generated by one of the light emitting diodes 20, 20', 20", 20'", 20"" and reflected through one of the light reflectors 24, 24', 24", 24'", 24"" to pass unobstructed through the light guide 12 to locations of multiple indicia described in reference to FIG. 3. A separate window region 42 of the light guide 12 is also maintained through the light guide 12 to allow light generated by the light emitting diode 22 and reflected by the light reflector 26 to pass through the light guide 12.

Referring to FIG. 3 and again to FIGS. 1 through 2, a polymeric substantially opaque film 44 is applied for example by adhesive bonding to the second face 32 including onto the touch capacitive circuits 34, the electrical traces 36, the touch capacitive sensors 38, and the electrical traces 39. According to several aspects, the opaque film 44 is black in color. Light generated by any of the light emitting diodes 20, 20', 20", 20'", 20"", 22 of the light guide 12 is blocked from passing through the opaque film 44 except at individual locations of multiple indicia 46, 46', 46", 46'", 46"". The indicia 46, 46', 46", 46'", 46"" are light transparent portions of the opaque film 44, and are each individually aligned with one of the window regions 40, 40', 40", 40'", 40"", 42 where maximum light enhancement is achieved by the light reflectors 24, 24', 24", 24'", 24"" or the light reflector 26.

Referring to FIG. 4 and again to FIGS. 1 through 3, all of the electronic components 16, 28, 30, 34 and 38, the light emitting diodes 20, 20', 20", 20'", 20"", 22 and the electrical traces 18, 19, 36 and 39 are supported directly on or directly by the light guide 12. The white film 31 is applied or ink printed over the entire first face 14 of the light guide 12 as previously described in reference to FIG. 1, and the opaque film 44 is bonded to the second face 32 of the light guide 12 to complete the laminated light guide and component carrier 10. According to further aspects, the white film 31 can also be applied or ink printed over the entire second face 32 of the light guide 12, with the opaque film 44 then bonded over the white film 31 only facing the second face 32. According to several aspects, a total thickness 48 of the laminated light guide and component carrier 10 may be approximately 2.0 mm, which maximizes the flexibility of the laminated light guide and component carrier 10. The laminated light guide and component carrier 10 can then be placed in an injection mold for subsequent placement of additional layers of protective or decorative polymeric films, or for inclusion of the laminated light guide and component carrier 10 for example into a pillar assembly of an automobile vehicle.

Referring to FIG. 5 and again to FIG. 4, each of the light emitting diodes 20, 20', 20", 20'", 20"", 22 of the laminated light guide and component carrier 10 are deposited into individual pockets or cavities which are pre-formed in the light guide 12, therefore the following discussion of one of the light emitting diodes 20'" applies to the installation of all of the light emitting diodes 20, 20', 20", 20'", 20"", 22. As shown in FIG. 5, the light emitting diode 20'" is positioned in a pocket 50 created in the light guide 12, such that an entire thickness of the light emitting diode 20'" is within a thickness of the light guide 12. Each of the light emitting diodes 20, 20', 20", 20'", 20"", 22 includes a lens 51 positioned directly in alignment with a texturally modified area 53 of one of the light reflectors 24, 24', 24", 24'", 24"", 26.

According to several aspects, the texturally modified areas 53 defining the light reflectors 24, 24', 24", 24'", 24"" are each positioned proximate to and according to several aspects in direct contact with a wall 55 of one of the pockets such as pocket 50. This ensures maximum enhancement of the light generated by the light emitting diodes. The light emitting diode 20'" includes attachment legs 52 made for example from copper which extend outward from the pocket 50 and are fixed for example by soldering to electrically connect the light emitting diode 20'" to the appropriate electrical traces 18, 19. While frictional contact between the light emitting diode 20'" and the walls of the pocket 50 may occur, the attachment legs 52 provide both the principle support and attachment of the light emitting diode 20'" to the light guide 12.

The light reflector 24'" is positioned between the light emitting diode 20'" and the opaque film 44. The pebbled geometry or texturally modified area 53 of the light reflector 24'" c an be incorporated throughout a thickness of the light reflector 24'", or can optionally be formed within the material of the light guide 12 proximate to the pocket 50 and thereby closest to the lens 51 of the light emitting diode 20'".

Referring to FIG. 6 and again to FIGS. 1 through 5, a laminated light guide and component carrier 54 is modified from the laminated light guide and component carrier 10 by eliminating the multiple light emitting diodes 20, 20', 20", 20'", 20"" in favor of a single light emitting diode 56 which illuminates a single light guide 58, and backlights multiple indicia 60. The laminated light guide and component carrier 54 includes a film body 62 having the single light emitting diode 56 supported from the film body 62. The single light guide 58 extends away from the light emitting diode 56. According to several aspects, a window region 64 similar in function to the window region 42 is created through the film body 62 to allow light generated by a light emitting diode 66 to pass through film body 62.

An exemplary sequence of manufacture of the laminated light guide and component carrier 10 can be as follows. The first electrical traces 18, 19 are printed on the first face 14 of the light guide 12. The second electrical traces 36, 39 together with the touch capacitive circuits 34 and the touch capacitive sensors 38, 38', 38", 38'", 38"" are printed on the second face 32 of the light guide 12. The white film 31 is then applied or ink printed over the first face 14 except at locations where the electronic components will be connected to the first electrical traces 18, 19. The electronic components 16 are then connected to the first electrical traces 18, 19 and the light emitting diodes 20, 20', 20", 20'", 20"", 22 are individually positioned in the cavities or pockets created in the first face 14 and are connected to the first electrical traces 18, 19. The polymeric opaque film 44 is then adhesively bonded to the second face 32 including onto the touch capacitive circuits 34, the electrical traces 36, the touch capacitive sensors 38, and the electrical traces 39.

Figure 7:
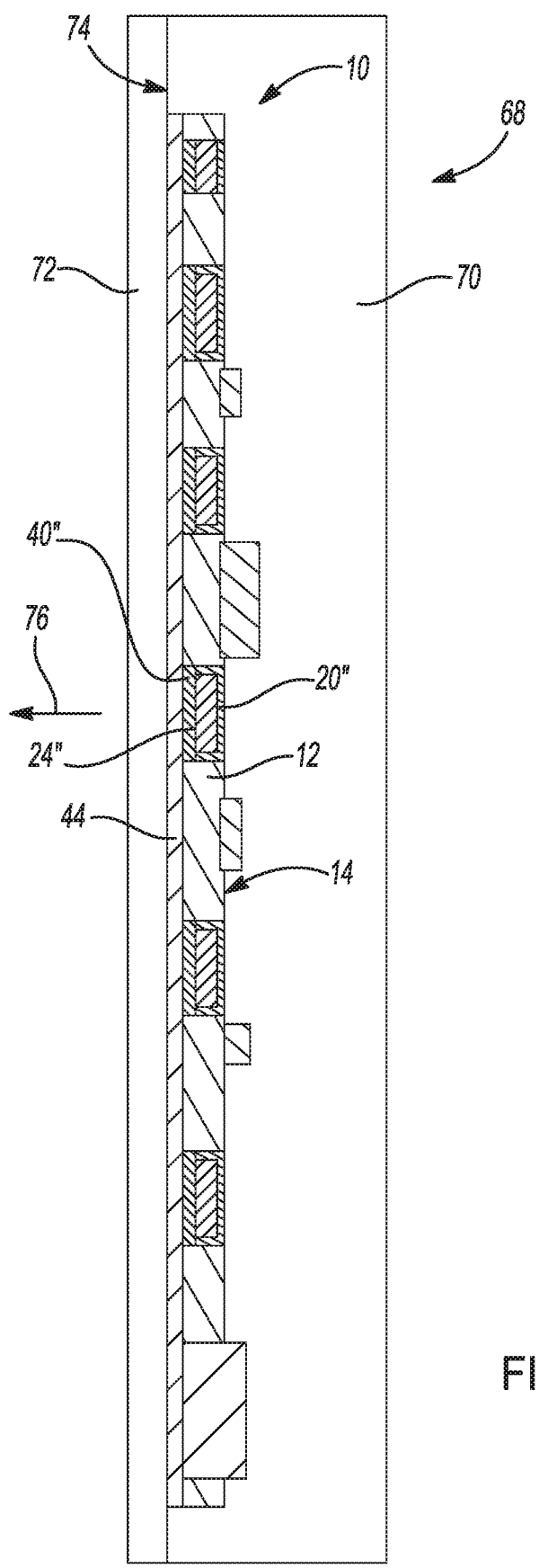
FIG. 7 is a cross sectional end elevational view modified from FIG. 4 to show a completed component having additional polymeric material layers added to the laminated light guide and component carrier.

Referring to FIG. 7 and again to FIGS. 1 through 6, after completion of the laminated light guide and component carrier 10, a completed assembly 68 is created by positioning the laminated light guide and component carrier 10 into a mold wherein a polymeric material such as acrylonitrile butadiene styrene (ABS) is injected to create a non-light transparent or opaque layer 70 over the components and features on the first face 14 and extends beyond a perimeter of the light guide 12. A clear or substantially transparent layer 72 of a polymeric material such as methyl methacrylate (PMMA) is then injection molded onto the opaque film 44 and onto a surface 74 of the opaque layer 70 which is substantially co-planar with an outside face of the opaque film 44. The transparent layer 72 allows light transmission in a transmission direction 76 from light generated by any one of the light emitting diodes 20, 20', 20", 20'", 20"", 22 to be transmitted via the light guide 12, through one of the light reflectors 24, 24', 24", 24'", 24"" and through the transparent layer 72. The specific LED 36 which is energized back-illuminates the particular indicium such as the indicium 46" of one of the window regions such as the window region 40".

A laminated light guide and component carrier of the present disclosure offers several advantages. These include the provision of light reflectors defining texturally modified areas of the material within a light guide which enhance light generated by light emitting diodes positioned proximate to the light reflectors. In addition, the light reflectors are positioned to provide for window regions of the light guide defined where capacitive touch sensors are aligned with one of the light reflectors and one of the light emitting diodes. A white film is also applied or ink printed onto a first face of the laminated light guide and component carrier to further enhance light dispersion. All components of the laminated light guide and component carrier are supported by the light guide, obviating the need for a component carrying film.

The description of the present disclosure is merely exemplary in nature and variations that do not depart from the gist of the present disclosure are intended to be within the scope of the present disclosure. Such variations are not to be regarded as a departure from the spirit and scope of the present disclosure.

What is claimed is:

1. A laminated light guide and component carrier, comprising:
    a light guide having a pocket created in a first face;
    a light emitting diode positioned in the pocket;
    first electrical traces printed on the first face of the light guide with the light emitting diode connected to the first electrical traces;
        a light reflector formed as a texturally modified area of the light guide within the light guide and proximate to the light emitting diode; and
    second electrical traces printed on a second face of the light guide,
        wherein the light guide including the light reflector is made of a light transmissive polymeric material with the light reflector defining a pebbled area.

2. The laminated light guide and component carrier of claim 1, wherein the light emitting diode is directly supported on the light guide by attachment legs which extend outward the pocket to electrically connect the light emitting diode to the first electrical traces.

3. The laminated light guide and component carrier of claim 1, wherein the light emitting diode includes a lens positioned directly in alignment with the texturally modified area of the light reflector to maximize light reflection within the light guide.

4. The laminated light guide and component carrier of claim 1, further including:
    a capacitive touch sensor printed on the second face of the light guide, the capacitive touch sensor connected to the second electrical traces; and
    a polymeric opaque film adhesively bonded to the second face over the capacitive touch sensor and the second electrical traces, a window region defined where the capacitive touch sensor is aligned with the light reflector and the light emitting diode.

5. The laminated light guide and component carrier of claim 4, wherein light generated by the light emitting diode is blocked from passing through the opaque film except at individual locations of indicia individually defining light transparent portions created in the opaque film.

6. The laminated light guide and component carrier of claim 5, wherein the indicia are each individually aligned with the window region where maximum light enhancement is achieved by the light reflector.

7. The laminated light guide and component carrier of claim 1, further including a white film applied or ink printed over the first face of the light guide except where the light emitting diode is bonded to the electrical traces, the white film enhancing light reflection within the light guide.

8. The laminated light guide and component carrier of claim 1, further including multiple electrical components mounted on the first face of the light guide and connected to the first electrical traces.

9. The laminated light guide and component carrier of claim 1, wherein the second electrical traces are connected to the first electrical traces by electrical vias extending through the light guide, with the first electrical traces and the second electrical traces connected to a connector positioned on the first face of the light guide.

10. The laminated light guide and component carrier of claim 1, further including an opaque polymeric material layer commonly applied over the light emitting diode and the first face of the light guide and extending beyond a perimeter of the light guide.

11. The laminated light guide and component carrier of claim 10, further including a transparent cover layer extending over the second face of the light guide opposite to the first face and a portion of the opaque polymeric material extending beyond the perimeter of the light guide.

12. The laminated light guide and component carrier of claim 11, wherein the transparent cover layer is applied onto a surface of the opaque polymeric material layer which is substantially co-planar with an outside face of the opaque polymeric material layer.

13. A laminated light guide and component carrier, comprising:
    a light guide of a light transmissive polymeric material, the light guide having a pocket created in a first face;

first electrical traces printed on the first face of the light guide;
 a light emitting diode positioned in the pocket and supported on the light guide by attachment legs which extend outward from the pocket to electrically connect the light emitting diode to the first electrical traces;
 a light reflector formed as a texturally modified area of the light guide within the light guide, the light reflector directly aligned with the light emitting diode;
at least one capacitive touch sensor printed on a second face of the light guide, each capacitive touch sensor connected to second electrical traces defining capacitive touch traces printed on the second face of the light guide; and
 a window region of the light guide defined where the at least one capacitive touch sensor is aligned with the light reflector and the light emitting diode.

14. The laminated light guide and component carrier of claim 13, further including:
 an opaque polymeric material layer commonly applied over the light emitting diode and the first face of the light guide and extending beyond a perimeter of the light guide; and
 a transparent cover layer extending over the second face of the light guide opposite to the first face and a portion of the opaque polymeric material extending beyond the perimeter of the light guide.

15. The laminated light guide and component carrier of claim 13, further including multiple electrical components mounted on the first face of the light guide electrically connected to the first electrical traces, wherein the light emitting diode, the at least one capacitive touch sensor, the electrical components, the first electrical traces and the second electrical traces are supported directly by and on the light guide.

16. The laminated light guide and component carrier of claim 13, wherein the texturally modified area defining the light reflector is positioned proximate to a wall of the pocket.

17. The laminated light guide and component carrier of claim 13, further including a polymeric opaque film adhesively bonded to the second face over the at least one capacitive touch sensor and the second electrical traces, wherein light generated by the light emitting diode is blocked from passing through the opaque film except at individual locations of indicia individually defining light transparent portions created in the opaque film.

18. A laminated light guide and component carrier, comprising:
 a light guide of a light transmissive polymeric material, the light guide having multiple pockets created in a first face;
 first electrical traces printed on the first face of the light guide;
 multiple light emitting diodes each positioned in one of the pockets and supported on the light guide by attachment legs which extend outward from each of the pockets to individually electrically connect the light emitting diodes to the first electrical traces such that the light emitting diodes are supported directly on the light guide;
 multiple light reflectors each formed as texturally modified areas of the light guide within the light guide, each positioned proximate to one of the pockets containing one of the light emitting diodes;
 a white film applied or ink printed over the first face of the light guide except where the light emitting diodes are bonded to the electrical traces, the white film enhancing light reflection of the light reflectors;
 multiple capacitive touch sensors printed on a second face of the light guide, each of the capacitive touch sensors connected to second electrical traces defining capacitive touch traces printed on the second face of the light guide; and
 a polymeric opaque film adhesively bonded to the second face over the capacitive touch sensors and the second electrical traces, wherein light generated by any of the light emitting diodes is blocked from passing through the opaque film except at individual locations of multiple indicia individually defining light transparent portions of the opaque film;
 wherein a window region is defined where each of the capacitive touch sensors is aligned with one of the light reflectors, each window region positioned in alignment with one of the indicium.

19. The laminated light guide and component carrier of claim 18, further including a connector mounted on the first face having the first electrical traces connected to the connector; wherein the second electrical traces are passed through vias extending through the light guide and are connected to the connector.

\* \* \* \* \*